United States Patent
Varnica et al.

(10) Patent No.: US 8,583,981 B2
(45) Date of Patent: Nov. 12, 2013

(54) CONCATENATED CODES FOR HOLOGRAPHIC STORAGE

(75) Inventors: Nedeljko Varnica, Sunnyvale, CA (US);
Gregory Burd, San Jose, CA (US);
Seo-How Low, San Jose, CA (US);
Lingyan Sun, Longmont, CO (US);
Zining Wu, Los Altos, CA (US)

(73) Assignee: Marvell World Trade Ltd., St. Michael (BB)

( * ) Notice: Subject to any disclaimer, the term of this patent is extended or adjusted under 35 U.S.C. 154(b) by 1153 days.

(21) Appl. No.: 11/955,005

(22) Filed: Dec. 12, 2007

(65) Prior Publication Data

US 2008/0163026 A1    Jul. 3, 2008

Related U.S. Application Data

(60) Provisional application No. 60/882,762, filed on Dec. 29, 2006.

(51) Int. Cl.
*H03M 13/00* (2006.01)
(52) U.S. Cl.
USPC ............ 714/755; 714/752; 714/758; 714/746
(58) Field of Classification Search
USPC .......................................................... 714/755
See application file for complete search history.

(56) References Cited

U.S. PATENT DOCUMENTS

| | | | |
|---|---|---|---|
| 4,610,022 A | 9/1986 | Kitayama et al. | |
| 5,365,530 A | 11/1994 | Yoshida | |
| 5,469,448 A | 11/1995 | Denissen et al. | |
| 6,279,133 B1 | 8/2001 | Vafai et al. | |
| 6,442,726 B1 | 8/2002 | Knefel | |
| 6,715,116 B2 | 3/2004 | Lester et al. | |
| 6,901,011 B2 | 5/2005 | Micheloni et al. | |
| 7,043,162 B2 | 5/2006 | Kubo et al. | |
| 7,142,612 B2 | 11/2006 | Horowitz et al. | |
| 7,184,486 B1 | 2/2007 | Wu et al. | |
| 7,246,294 B2 * | 7/2007 | Kauschke et al. | ............ 714/755 |
| 7,259,997 B2 | 8/2007 | You | |
| 7,310,768 B2 | 12/2007 | Eidson et al. | |

(Continued)

FOREIGN PATENT DOCUMENTS

| | | |
|---|---|---|
| JP | 09-251427 | 9/1997 |
| JP | 2006-260619 | 9/2006 |

(Continued)

OTHER PUBLICATIONS

Battail et al., "Pseudo-Random Recursive Convolutional Coding for Near-Capacity Performance", Global Telecommunications Conference, IEEE vol. 4, pp. 23-27, 1993.

(Continued)

*Primary Examiner* — Albert Decady
*Assistant Examiner* — Justin R Knapp

(57) ABSTRACT

Systems and methods for constructing concatenated codes for data storage channels, such as holographic storage channels, are provided. The concatenated codes include an outer BCH code and an inner iteratively decodable code, such as an LDPC code or turbo code. The correction power and coding rate of one or both of the codes may be programmable based on the channel characteristics and the desired SNR coding gain. The correction power and/or coding rate of the inner and/or outer code may also be dynamically adjusted in real-time to compensate for time-varying error conditions on the channel.

22 Claims, 13 Drawing Sheets

(56) References Cited

U.S. PATENT DOCUMENTS

| | | | |
|---|---|---|---|
| 7,346,829 B2 | 3/2008 | Riho et al. | |
| 7,379,505 B2 | 5/2008 | Zaleski et al. | |
| 7,409,622 B1* | 8/2008 | Lu et al. ................. | 714/755 |
| 7,516,391 B2 | 4/2009 | Kyung et al. | |
| 7,668,381 B2 | 2/2010 | Masumoto et al. | |
| 7,673,226 B2 | 3/2010 | Eroz et al. | |
| 7,774,681 B2* | 8/2010 | Earhart et al. ........... | 714/763 |
| 7,861,131 B1* | 12/2010 | Xu et al. ................. | 714/752 |
| 8,055,979 B2 | 11/2011 | Wu et al. | |
| 2001/0025358 A1 | 9/2001 | Eidson et al. | |
| 2002/0038440 A1 | 3/2002 | Barkan | |
| 2004/0042294 A1 | 3/2004 | Guterman | |
| 2004/0054960 A1* | 3/2004 | Eroz et al. ............... | 714/800 |
| 2004/0062111 A1 | 4/2004 | Tanzawa et al. | |
| 2004/0083334 A1 | 4/2004 | Chang et al. | |
| 2004/0093549 A1* | 5/2004 | Song et al. ............... | 714/752 |
| 2004/0261002 A1 | 12/2004 | Eidson et al. | |
| 2005/0060635 A1* | 3/2005 | Eroz et al. ............... | 714/801 |
| 2005/0074173 A1 | 4/2005 | Lee et al. | |
| 2005/0091565 A1* | 4/2005 | Eroz et al. ............... | 714/752 |
| 2005/0091570 A1* | 4/2005 | Eroz et al. ............... | 714/800 |
| 2005/0180525 A1* | 8/2005 | Hansen et al. ........... | 375/295 |
| 2005/0229076 A1 | 10/2005 | Riho et al. | |
| 2007/0171730 A1 | 7/2007 | Ramamoorthy et al. | |
| 2007/0204206 A1 | 8/2007 | Lee et al. | |
| 2008/0198264 A1 | 8/2008 | Balram | |

FOREIGN PATENT DOCUMENTS

| | | |
|---|---|---|
| JP | 2007-299499 | 11/2007 |
| KR | 246184 | 12/1999 |
| TW | 575806 | 2/2004 |
| WO | WO 02/086719 | 10/2002 |
| WO | WO 2005/036401 | 4/2005 |
| WO | WO 2006/020484 | 2/2006 |

OTHER PUBLICATIONS

Benedetto, "Design of Parallel Concatenated Convolutional Codes", IEEE Transactions on Communications, vol. 44, No. 5, pp. 591-600, May 1996.

Benedetto et al., "Serial Concatenated Trellis Coded Modualtion with Iterative Decoding", Proceedings 1997 IEEE International Symposium on Information Theory, p. 8, Jun. 29-Jul. 4, 1997.

Blaum, "A Family of Efficient Burst-Correcting Array Codes", IEEE Transactions on Information Theory, vol. 36, No. 3, pp. 671-675, May 1990.

Gallager, "Low-Density Parity-Check Codes", IRE Transactions on Information Theory, pp. 21-28, Jan. 1962.

Hewitt, "Turbo Product Codes for LMDS", Radio and Wireless Conference, RAWCON 99, IEEE, pp. 107-111, Aug. 1-4, 1999.

Imai and Hirakawa, "A New Multilevel Coding Method Using Error-Correcting Codes", IEEE Transactions on Information Theory, vol. IT-23, No. 3, pp. 371-377, May 1977.

Ungerboeck, "Channel Coding with Multilevel/Phase Signals", IEEE Transactions on Information Theory, vol. IT-28, No. 1, pp. 55-67, Jan. 1982.

Wei, "Trellis-Coded Modulation with Multidimensional Constellations", IEEE Transactions on Information Theory, vol. IT-33, No. 4, pp. 483-501, Jul. 1987.

Wicked, Ed., "Error Control Systems for Digital Communication and Storage" Prentice-Hall, Inc., Englewood Cliffs, NJ © 1995. The title page, copyright page and table of contents are enclosed herewith, 9 pages total.

* cited by examiner

CONCATENATED CODES FOR HOLOGRAPHIC STORAGE

CROSS REFERENCE TO RELATED APPLICATIONS

This claims the benefit of copending, commonly-assigned U.S. Provisional Patent Application No. 60/882,762 filed Dec. 29, 2006, which is hereby incorporated by reference herein in its entirety.

BACKGROUND OF THE INVENTION

This invention generally relates to systems and methods for designing error-correcting codes used to write and read data on data storage channels. In particular, embodiments of the invention pertain to systems and methods for constructing high-performance concatenated codes for holographic data storage channels.

As demand for digital data storage capacity increases, data storage systems must continue to store and retrieve data accurately, reliably, and quickly. The accuracy, reliability, and throughput of data storage may decrease due to any number of sources for error. For example, noise or interference present in the data storage channel, defects in a data storage medium, and intersymbol interference may result in data read or write errors. Some communication or data storage channels are also subject to errors which are dependent on the particular data symbols being written to or read from the data storage channel. In other words, the statistics, such as the mean and variance, of the noise corrupting the signals corresponding to the data symbols are different or asymmetric. Inevitably, the data stored in data storage systems using such channels is a distorted version of the written data.

Data storage systems often use error-correcting codes to increase data storage accuracy, reliability, and throughput. Error-correcting codes may achieve these improvements by encoding data at a transmitter, often during the data writing process, into a set of data symbols. This encoding process adds redundancy, so that the length of the block of data written to the data storage medium is often longer than the amount of originally transmitted data. Decoding may be performed by employing an efficient decoding algorithm after the data is read from the data storage medium. This decoding algorithm may be implemented on data processing circuitry, such as a field-programmable gate array (FPGA) or application specific integrated circuit (ASIC).

One error-prone data storage system is a holographic data storage system, which uses a holographic disk as its data storage medium and transmits data over a holographic data storage channel. In certain holographic data storage systems, data is arranged in an array, or page, of about a million (or more) bits. The pages may then be organized into chapters, and the chapters may be organized into books. High data storage densities of up to 320 pages per book have been achieved. These pages are stored within the same three-dimensional disk space, with each page offset from the next one by a very small angle (e.g., offset by 0.067 degrees). In addition, in order to achieve high storage densities, the spacing between the books may be minimized (e.g., book spacing of 700 micrometers has been achieved). Further, the holographic data storage channel is often an asymmetric channel.

Due to these and other characteristics of holographic data storage systems, powerful error-correction codes are needed to minimize the system's bit error rate (BER) and/or sector error rate (SER) and maximize the system's coding gain. The BER is the ratio of the number of incorrectly decoded data bits versus the total number of transmitted data bits. Similarly, the SER is the ratio of the number of incorrectly decoded sectors/blocks of data bits versus the total number of transmitted sectors/blocks. Finally, the signal to noise ratio is the ratio of signal power to noise power as data is transmitted on a channel, such as a holographic data storage channel. Because holographic storage channels have strict system requirements, very strong error correction codes are needed that achieve large SNR gains.

One method for achieving higher performance of forward error correction codes without the use of particularly long codes is to use a family of codes known as concatenated codes. For example, FIG. 1 shows system 100 for encoding and decoding user information using a concatenated code. A simple concatenated code is formed from two codes: an $(n_1, k_1)$ code $C_1$ and an $(n_2, k_2)$ code $C_2$. More than two codes may be used in other concatenated code implementations. Concatenation of two error correcting codes typically utilizes an inner encoder or decoder and an outer encoder or decoder. The terms "inner" and "outer" refer to the physical location of the encoders/decoders in the transmission system relative to the communication channel. As shown in the example of system 100, inner encoder 104 and inner decoder 108 are positioned closer to channel 106, while outer encoder 102 and outer decoder 110 are positioned outside of inner encoder 104 and inner decoder 108, respectively.

System 100 includes concatenated encoders 102 and 104 where outer encoder 102 has a $(n_2, k_2)$ code and is coupled to inner encoder 104 of a $(n_1, k_1)$ code. The output of encoder 104 may be stored on or written to channel 106. The stored data may be received by a receiver comprising concatenated decoders 108 and 110. Inner decoder 108 may decode code $(n_1, k_1)$, and outer decoder 110 may decode code $(n_2, k_2)$.

FIG. 1 illustrates the typical encoding process used with concatenated codes. The encoding process typically consists of two steps. First, the binary user information data is parsed into blocks of $k_2$ user information digits each. These $k_2$ bits are then encoded according to the rules for $C_2$ to form an $n_2$-bit codeword. Second, the $n_2$-bit codewords are grouped (and possibly interleaved) and then parsed into blocks of $k_1$ bits. Then, each block of $k_1$ bits is encoded into a codeword in $C_1$, resulting in a string of codewords of $C_1$. These digits may then be transmitted one codeword at a time in succession onto channel 106.

The decoding process is also generally performed in two steps. Decoding is first performed for each $C_1$ codeword as it arrives using a decoding algorithm for the inner code, and then the check digits (or parity bits) are removed. These bits are then decoded using a decoding algorithm for the $C_2$ outer code, resulting in the final corrected user information. Although the example of system 100 shows one-level concatenation, multi-level concatenation may also be used. In multi-level concatenation, several codes are used to form multiple concatenated codes. These codes may then be combined to form an overall concatenated code.

Since the accuracy and reliability of a holographic data storage system suffers when the SNR is low, there is a continuing interest in constructing efficient concatenated codes that will provide significant improvements in SNR when implemented on particular data storage channels.

SUMMARY OF THE INVENTION

In accordance with the principles of the invention, systems and methods for constructing concatenated codes are provided. In general, the systems and methods realize this construction through a series of processing steps which take into account parameters related to the desired performance, throughput, and memory usage of the concatenated codes when implemented in an accompanying decoder. Generally, the decoder is implemented in part of the resources or memory of a field programmable gate array (FPGA) or an application specific integrated circuit (ASIC).

Specifically, an outer Bose, Chaudhuri, and Hocquenghem (BCH) encoder is configured to encode user information and output BCH codewords. An inner iterative encoder, such as a low-density parity check (LDPC) or turbo encoder, is responsive to the output of the BCH encoder and outputs resultant codewords that are then written to a channel, such as a holographic data storage channel. To decode the encoded information on the channel, the encoded information is received by an inner iterative decoder, such as an LDPC or turbo decoder. A BCH decoder is responsive to the output of the inner iterative decoder and outputs the decoded, corrected user information.

In some embodiments, the outer code (e.g., the BCH code) may be designed to remove up to T errors.

Thus, the correction power, $T_{BCH}$, of the outer BCH code may be chosen according to the estimated or projected defect size. The outer BCH decoder may operate on the codeword level, where each codeword may typically include interleaved bits from one page of a holographic storage channel. In some embodiments, the outer BCH encoder may additionally or alternatively operate on the page level.

After the correction power for the outer BCH code is selected, the inner code rate may be selected based on the overall system code rate requirement. This overall system code rate requirement may be based, at least in part, on the required or desired SNR coding gain. For example, the inner code rate may be chosen in accordance with:

$$R_{inner} = \frac{R_S}{R_{BCH}} \quad \text{(EQ 1)}$$

where $R_{inner}$ is the code rate of the inner code, $R_s$ is the overall system code rate, and $R_{BCH}$ is the code rate for the outer BCH code.

After the inner code rate has been selected based on the overall system code rate requirement, the inner, iteratively decodable code may be designed for the given inner code rate. Finally, the outer BCH code may be designed for the given outer code rate (i.e., the correction power, $T_{BCH}$).

In some embodiments, one or more of the inner code and the outer code may be programmable in that the correction powers or code rates may be set according to required channel conditions (e.g., for a given defect condition). An ECC processor or software subroutine may set the correction power or code rate of the inner code, the outer code, or both the inner and outer codes. Programmable input signals may also be provided on a field programmable gate array (FPGA) or an application specific integrated circuit (ASIC). The programmable input signals may be used to program the desired correction power or code rate. The correction power or code rate of any of these codes may be dynamically set or adjusted to adapt to varying (e.g., time-varying) defect conditions, resulting in a more robust concatenated code implementation.

In some embodiments, a mother matrix representation of a quasi-cyclic parity check matrix may be constructed for a particular LDPC inner code. The number of rows, $M_p$, in the mother matrix may then be reduced by some number of rows, and the extra bits may be used for the outer code (e.g., the BCH code). This may allow for accordingly higher outer code (e.g., BCH code) correction power. Any remaining information bits for the inner LDPC code may be set to some known pattern (e.g., the remaining bits may be padded with zero bits). In some embodiments, to achieve even greater flexibility in the inner versus outer code rates, only a portion of a mother matrix row may be used. Using only a portion of a mother matrix row may increase implementation complexity, but allow for a wider spectrum of coding rates.

Another programmable code uses a set of stored inner codes (e.g., a set of stored LDPC codes), each code having a different value of $M_p$ and the same circulant size $S_c$. Then, one of the inner codes in the code set may be programmably selected depending on the channel conditions, the channel detector performance, and/or the desired sector error rate (SER). Similar to the embodiment described above, the output of the outer encoder may be padded with a known value (e.g., zero padding may be used) before the inner encoding step.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION

The systems and methods of the invention generally relate to correcting and/or detecting errors associated with the communication and/or storage of data. In general, and as will be discussed in more detail below, such communication or data storage occurs on a channel, which refers to a medium on which a data-bearing signal is communicated and/or stored, as well as events that may physically affect the medium. Various aspects of a channel may corrupt data that is communicated or stored thereon, and the data recovered subsequent to communication or storage may be different from their intended values. Such differences are referred to as errors.

Some communication and/or data storage channels are subject to errors which are dependent on the data symbol being transmitted. In other words, the statistics, such as the mean and variance, of the noise corrupting the signals corresponding to the data symbols are different. An example of such a channel is the channel whose signal statistics are depicted in FIG. 2.

Figure 1:
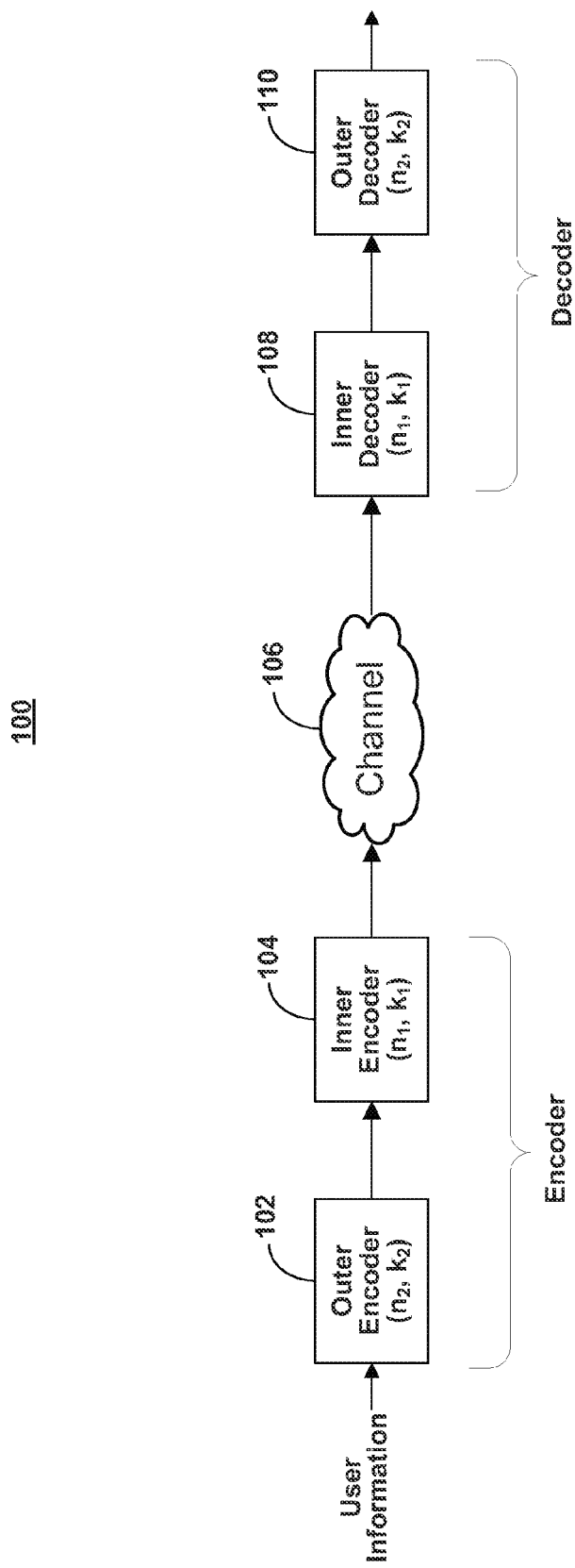
FIG. 1 shows a illustrative concatenated encoding and decoding sequence in accordance with one embodiment of the invention.
Figure 2:
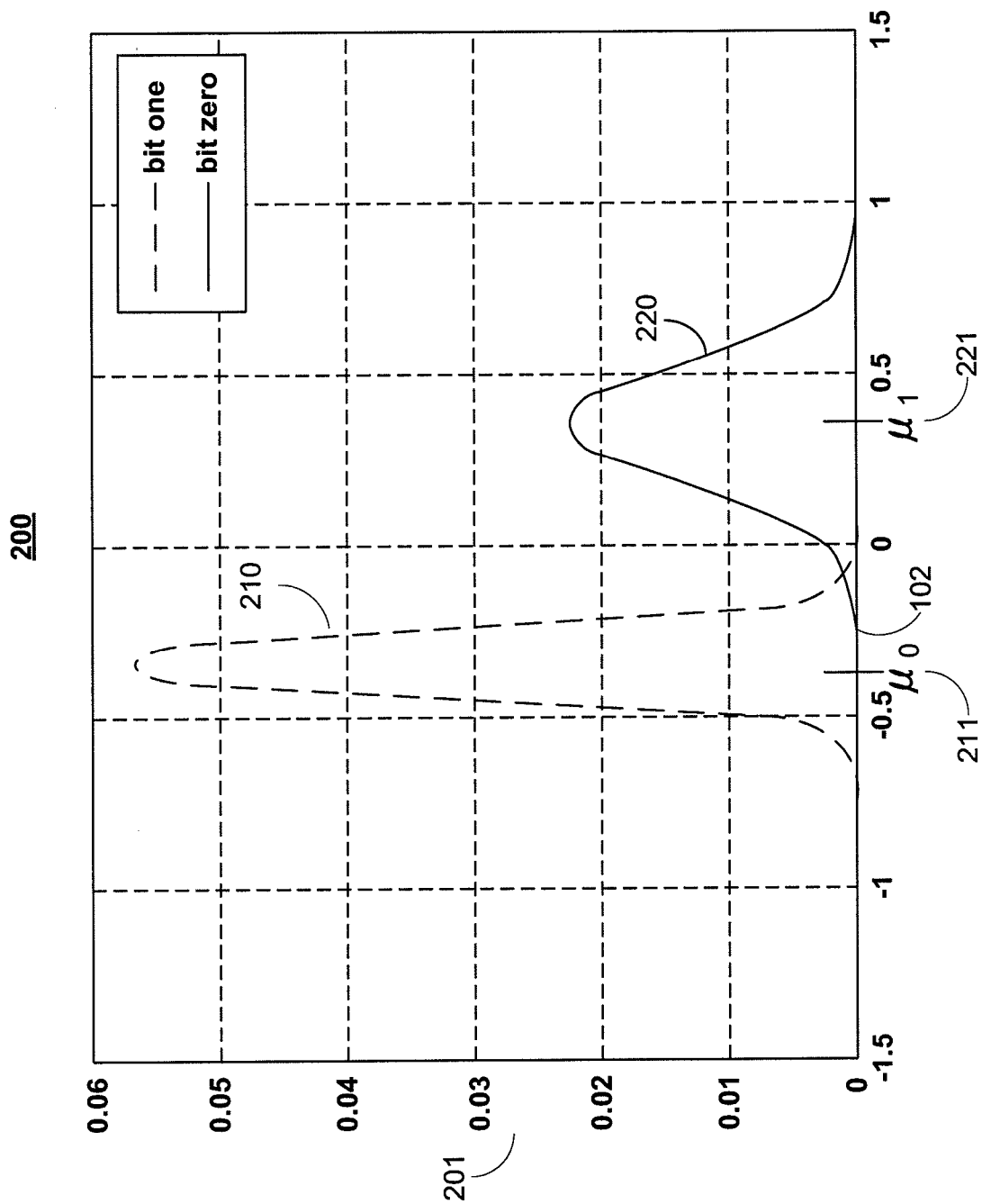
FIG. 2 shows an illustrative set of signal statistics for an asymmetric Gaussian channel in accordance with one embodiment of the invention.

FIG. 2 shows an illustrative set of noise components with asymmetrical signal statistics for an asymmetric Gaussian channel. Graph 200 shows the value of the channel's probability density function on its y-axis 201, and the value of the input to the probability density function on the x-axis 202. The signal statistics for the noise component corresponding to bit "0" is shown as first probability density function 210. First probability density function 210 is Gaussian and has mean $\mu_0$ 211 and variance $\sigma_0^2$. The signal statistics for the noise component corresponding to bit "1" is shown as second probability density function 220. Second probability density function 220 is Gaussian and has mean $\mu_1$ 221 and variance $\sigma_1^2$. Note that in FIG. 2, $\mu_0 \neq \mu_1$ and $\sigma_0^2 \neq \sigma_1^2$.

In various embodiments, the asymmetric channel statistics depicted in graph 200 may include any number of probability density functions 210 and 220, including 1, 2, 3, 4, 5, 8, 10, 15, 20, 30, 40, 50, 75, 100, or more than 100 probability density functions corresponding to noise components of a similar number of data symbols. In addition, the probability density functions may depict the values of a uniform random variable, exponential random variable, geometric random variable, Poisson random variable, or any such suitable random variable that describes a random process.

The asymmetric signal statistics shown in graph 200 may be the signal statistics of a data communications channel, magnetic storage channel, holographic storage channel, or any suitable type of channel. The systems and methods described herein may be applied to asymmetric channels in general, and holographic storage channels in particular. In holographic storage systems, data may be arranged in an array or page of around a million (or more) bits. The pages may be organized into chapters, the chapters may be organized into books, and the books may be organized into volumes. To read the data that is written in a given volume from a holographic storage channel for a holographic storage system, a laser beam is deflected off of a hologram to produce a 3-D image which is a distorted version of the originally stored data. This 3-D image is then projected onto a detector that reads the data in parallel off of the holographic storage channel for the holographic storage system. This parallel read out of data provides the holographic storage channel with fast data transfer rates.

Figure 3:
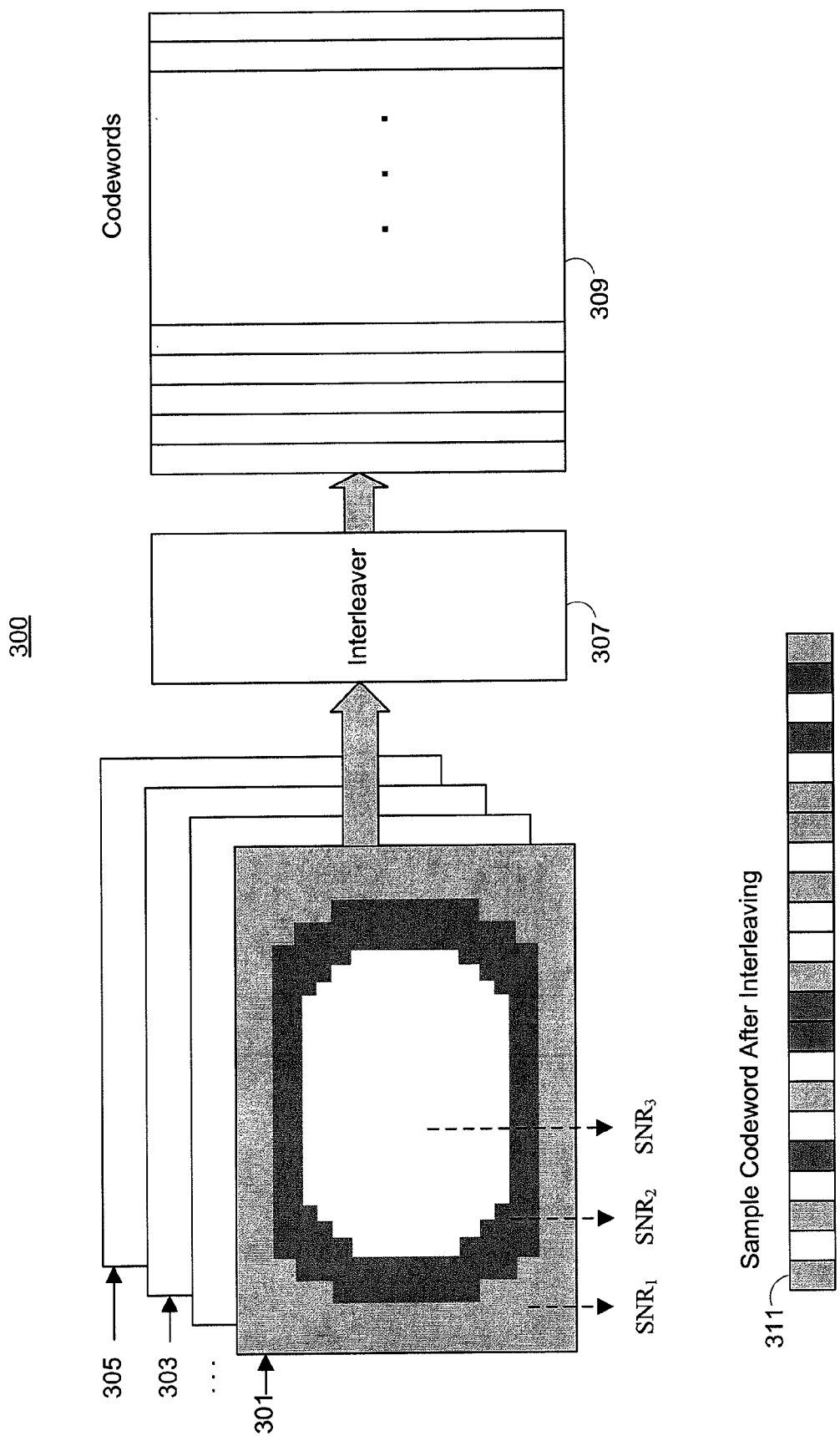
FIG. 3 shows an illustrative system for generating interleaved codewords from a holographic storage channel in accordance with one embodiment of the invention.

As previously mentioned, holographic storage systems typically store data in pages. As shown in system 300 of FIG. 3, data may be stored on or across pages 301, 303, and 305. The SNR of a single page is usually not uniform across the entire page. For example, due to the properties of the holographic storage channel, data stored along the perimeter of page 301 may have a lower SNR than data stored in the center area of the page. As such, page 301 may exhibit several different SNR values. As shown in the generalized example of FIG. 3, page 301 exhibits three different SNR values, $SNR_1$, $SNR_2$, and $SNR_3$. Since the SNR is typically not uniform across a page, data stored on page 301 is typically interleaved by interleaver 307 in order to create codewords 309 for decoding. Interleaving may help equalize the SNR of codewords 309. Sample codeword 311 shows an codeword formed from interleaved portions of page 301.

As previously mentioned, there are several potential sources of errors in holographic storage systems. In addition to Gaussian noise and the issue of non-uniform SNR across a page, the holographic channel and/or channel detector occasionally may also introduce errors or defect bits. For example, an entire line or strip in a page may be read or written incorrectly. This entire strip or line may include defect bits. As shown in system 400 of FIG. 4, page 402 may include at least one defect line, such as defect line 404. Since defect line 404 may be interleaved before encoding/decoding, the bits in defect line 404 may be spread into different codewords.

Figure 4:
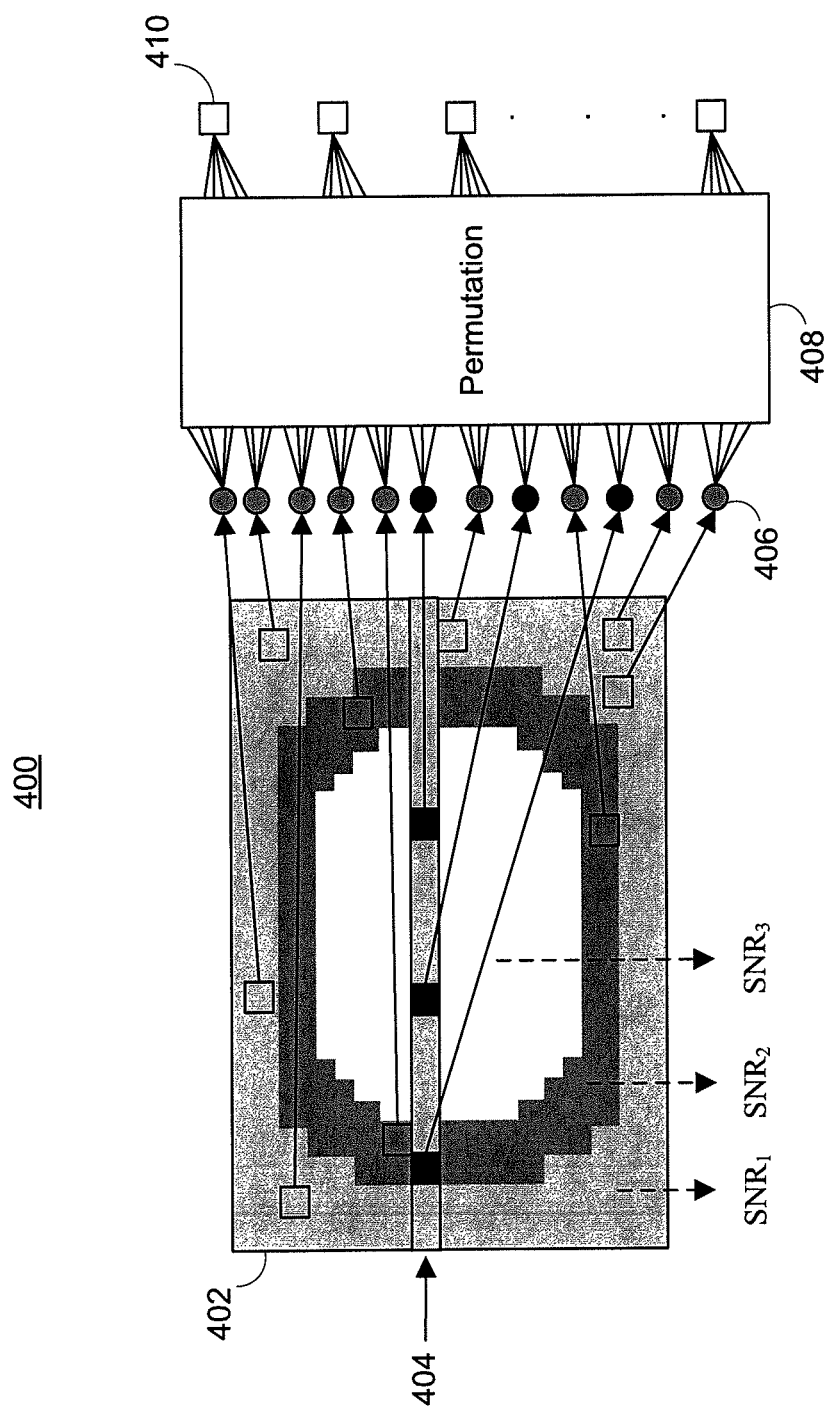
FIG. 4 shows the illustrative effect a defect line has on an illustrative LDPC code in accordance with one embodiment of the invention.

For example, as shown by the generic bi-partite graph representation of LDPC codes shown on the right in FIG. 4 (also known as a Tanner graph), several variable nodes, such as variable node 406, may include bits from defect line 404. These defect bits may be used by permutation block 408 to connect to check nodes, such as check node 410. In addition, bits from defect line 404 may be interleaved into different codewords. Iterative codes, such as LDPC or turbo codes, are very susceptible to these types of defects.

Iterative algorithms (e.g., belief-propagation or generally soft-input/soft-output algorithms, such as BCJR or SOVA) may use soft information in making detection decisions. Therefore, these types of algorithms may be especially vulnerable to defect input log-likelihood ratios (input LLRs), particularly those defect input LLRs with large magnitudes. For example, the LLR for bit i may be given in accordance with:

$$LLR_i = \log\left(\frac{P(b_i = 0 \mid y)}{P(b_i = 1 \mid y)}\right) \qquad \text{(EQ 2)}$$

where $P(b_i=0)$ is the probability of bit i being "0" and $P(b_i=1)$ is the probability of bit i being "1" given the detected signal, y. Assuming the maximum (or a large) LLR amplitude for the defect LLR values, the performance of an LDPC code (or other iterative code) on a holographic channel suffers greatly with a large number of defect LLRs.

However, using a concatenated code on these channels, and in particular on holographic storage channels, results in improved performance with a lower error rate at increased SNR ranges. As shown in system 500 of FIG. 5, a concatenated code may be used where a BCH code is used as the outer code and an iteratively decodable code (such as an LDPC code or turbo code) is used as the inner code. User information 502 may be first encoded by BCH encoder 504. BCH codewords 506 may be output by BCH encoder 504. BCH encoder 504 may also receive one or more user-programmable inputs, such as programmable input 503, for setting various properties of the BCH code. For example, as described in more detail below, the user may set the BCH correction power, $T_{BCH}$, of the BCH code. Programmable input 503 may also be used to select one specific BCH code from a set of available BCH codes with different rates and/or performance characteristics. In some embodiments, programmable input 503 is coupled to an ECC processor or software subroutine that dynamically adjusts the $T_{BCH}$ parameter value and/or selects the desired BCH code in real-time.

BCH codewords 506 may then be encoded by iterative encoder 508. For example, iterative encoder 508 may include an LDPC encoder, a turbo encoder, or any other encoder for an iteratively decodable code. In some embodiments, iterative encoder 508 is configured to operate in a plurality of different modes where a different type of code is used for encoding in each mode. For example, programmable input 507 may select which type of code to use. As described in more detail below, programmable input 507 may also be used to select one specific LDPC code from a set of available LDPC codes with different rates and/or performance characteristics. In some embodiments, programmable input 507 is coupled to an ECC processor or software subroutine that dynamically selects the desired LDPC code in real-time based on varying channel error statistics. Resultant codewords 510 may then be stored on, or communicated across, channel 512. Channel 512 may include any data communications or storage channel, such as a magnetic storage channel, optical storage channel, holographic storage channel, or any other suitable type of channel. To decode the encoded information on channel 512, received waveform 514 is read from channel 512. Received waveform 514 may first be decoded by iterative decoder 516. BCH decoder 518 may then be responsive to the output of iterative decoder 516. Finally, BCH decoder 518 may output corrected and decoded user information 520.

The outer BCH code may be chosen so that it removes up to T errors. In other words, the correction power, $T_{BCH}$, of the BCH code may be chosen to clean up all (or most of) the errors after the inner iterative decoder (i.e., iterative decoder 516). As previously described, iterative decoder 516, which uses soft information in the decoding process, often fails on some of the bits whose LLRs were in defect line 404 (FIG. 4). BCH decoder 518, which uses hard information, is designed to correct the remaining errors in the output of iterative decoder 516.

In some embodiments, the outer BCH code may operate on the codeword level (where each codeword typically includes interleaved bits from a single page). In other embodiments, the BCH encoding/decoding may be multiplexed to operate on the page level. In either implementation, the concatenated code may yield better performance (i.e., lower error rates) than using an iteratively decodable code alone.

Figure 6:
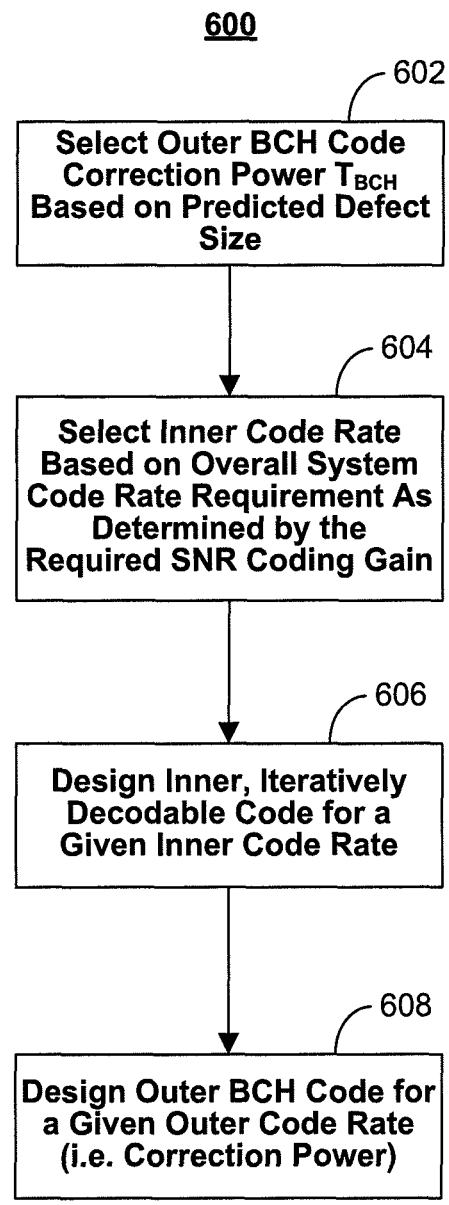
FIG. 6 is an illustrative process for designing an inner and outer code in accordance with one embodiment of the invention.

FIG. 6 shows illustrative process 600 for constructing a concatenated code for encoding and decoding user information on a communication or storage channel (e.g., a holographic storage channel). At step 602, the outer BCH code correction power, $T_{BCH}$, may be selected based on the predicted defect size. For example, the number of output errors from the inner iterative encoder/decoder may be experimentally determined at some target SNR. This determination may also be based on projected or estimated noise levels within the system or channel or known or estimated error statistics of the particular channel. In some embodiments, as described in more detail below, the value of $T_{BCH}$ may also be a programmable input.

At step 604, the inner code rate may be selected based on the overall system code rate requirement. The overall system code rate requirement may be based, at least in part, on the required or desired SNR coding gain. For example, the inner code rate may be computed in accordance with EQ 1 in some embodiments. After the outer BCH code correction power is selected at step 602 and the inner code rate is selected at step 604, the inner code and outer code may be designed at steps 606 and 608, respectively. In some embodiments, steps 606 and 608 may be combined into a single joint implementation step, taking into account the error statistics of both codes. The inner code that is designed at step 606 may be any iteratively decodable code, such as an LDPC or turbo code. For example, the inner code may be an LDPC code constructed or designed according to the methods and systems described in commonly-assigned U.S. patent application Ser. No. 11/893,936, filed Aug. 17, 2007, which is hereby incorporated by reference herein in its entirety.

In practice, one or more steps shown in process 600 may be combined with other steps, performed in any suitable order, performed in parallel (e.g., simultaneously or substantially simultaneously), or removed.

In some embodiments, the inner code, the outer code, or both the inner code and the outer code are at least partially user-programmable. For example, in some embodiments, a mother matrix representation of a quasi-cyclic parity check matrix may be constructed for a particular LDPC inner code. The number of rows, $M_p$, in the mother matrix may then be reduced by some number of rows, and the extra bits may be used for the outer code (e.g., the BCH code). This may allow for an accordingly higher outer code (e.g., BCH code) correction power. Any remaining information bits for the inner LDPC code may be set to some known pattern (e.g., the remaining bits may be padded with zero bits). In some embodiments, to achieve even greater flexibility in the inner versus outer code rates, only a portion of a mother matrix row may be used. Using only a portion of a mother matrix row may increase implementation complexity, but allow for a wider spectrum of coding rates.

Figure 5:
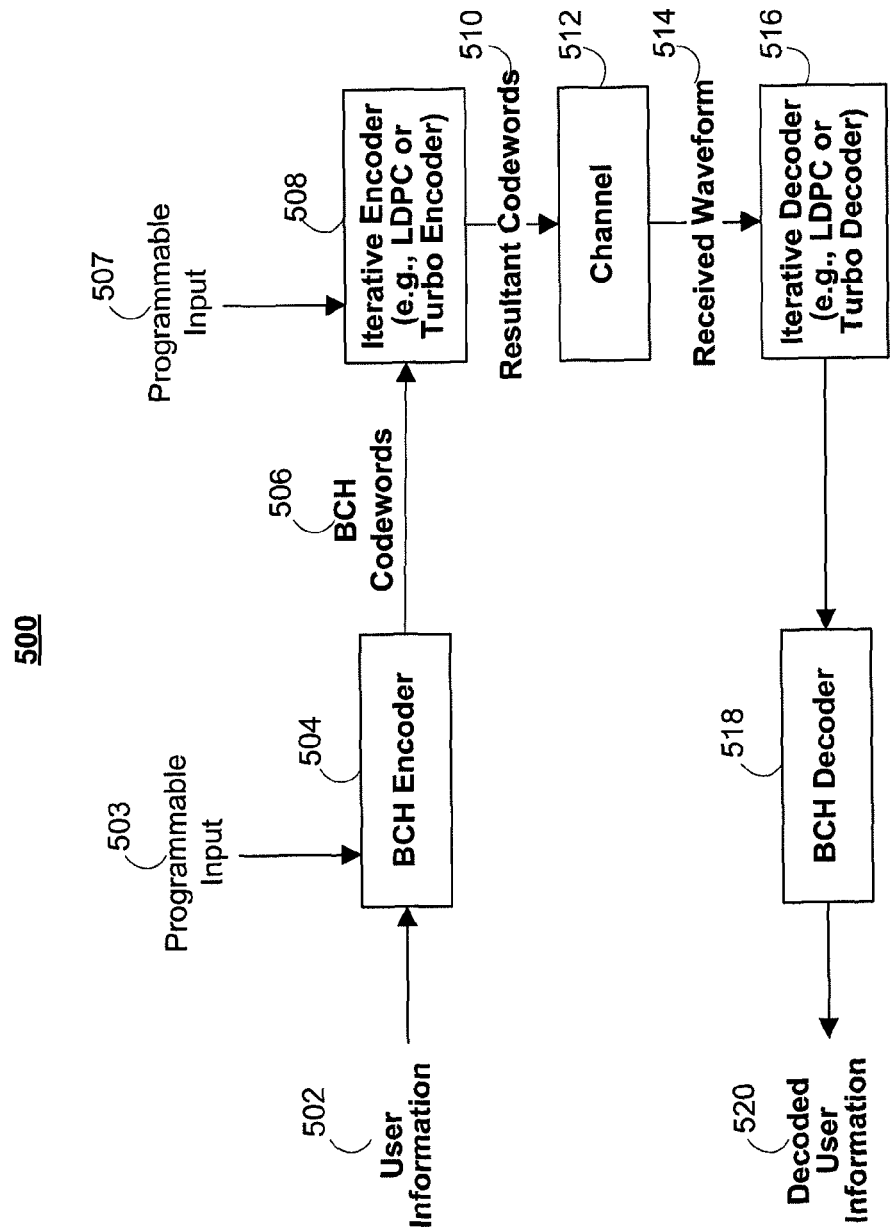
FIG. 5 shows an illustrative concatenated encoding/decoding system in accordance with one embodiment of the invention.

The user may select the $M_p$ parameter and/or the desired BCH correction power using one or more of programmable inputs 503 and 507 (FIG. 5). For example, to indicate a BCH correction power $T_{BCH}=34$, the user may set programmable input 503 (FIG. 5) to some predetermined value. Any suitable correction power may be selected by setting programmable input 503 (FIG. 5) to some other predetermined value.

As an example, in one embodiment, a quasi-cyclic LDPC code with 32 rows and 64 columns in the mother matrix may be used. Reducing the number of rows, $M_p$, in the mother matrix achieves a higher code rate of the LDPC code and allows for an accordingly higher BCH correction power. As an example, with a circulant size $S_c$ of 512, if the value of $M_p$ is reduced from 32 to 31, 512 extra bits may be used by the outer BCH code. The correction power of the BCH code can then be set to, for example, $T_{BCH}=34$ with a field size m=15. The remaining bits (e.g., 512−(34×15), or 2 bits, in the above example) may be set to any known pattern. For example, the remaining bits may be padded with zero bits. In more complex implementations, only a part of a row of the mother matrix may be used. This may allow for a wider range of coding rates and correction powers.

Another programmable approach uses a set of more than one inner (e.g., LDPC) code, each code having a different value of $M_p$ and the same circulant size $S_c$. Then, one of the inner codes in the code set may be programmably selected depending on the channel conditions, the channel detector performance, and/or the desired sector error rate (SER). Similar to the embodiment described above, the output of the outer encoder may be padded with a known value (e.g., zero padding may be used) before the inner decoding step. The user may select a desired LDPC code from the code set using one or more of programmable inputs 503 and 507 (FIG. 5).

As an example, using a circulant size $S_c$ of 256 and 128 columns in the mother matrix ($N_p=128$), then the overall block length may be given by 128×256, or 32K bits. Now a set of LDPC codes may be designed with different rate assignments. Different BCH correction powers may then be supported while maintaining the overall system code rate requirement (e.g., $R_S=1/2$). The exact code rate may be achieved by inserting one or more known bit patterns, such as zero bits. Table 1, below, shows some illustrative LDPC code rates, $R_{LDPC}$, corresponding BCH correction powers, $T_{BCH}$, and the number of bits to pad in order to achieve the overall system code rate requirement ($R_S=1/2$ in the example shown in Table 1 below). An ECC processor or software routine may select the appropriate LDPC code based on, for example, channel conditions and/or the channel detector performance.

TABLE 1

| $R_{LDPC}$ | $T_{BCH}$ | Padding (bits) |
|---|---|---|
| 65/128 | 17 | 1 |
| 66/128 | 34 | 2 |
| 67/128 | 51 | 3 |
| 68/128 | 68 | 4 |
| 69/128 | 85 | 5 |

Referring now to FIGS. 7A-7G, various exemplary implementations of the present invention are shown.

Figure 7A:
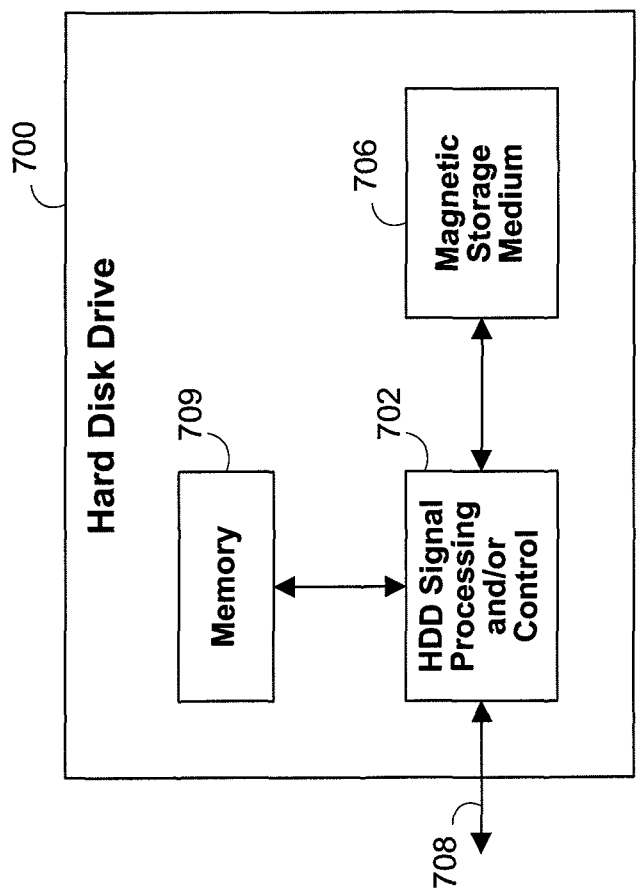
FIG. 7A shows a block diagram of an exemplary hard disk drive that can employ the disclosed technology.

Referring now to FIG. 7A, the present invention can be implemented in a hard disk drive 700. The present invention may implement either or both signal processing and/or control circuits, which are generally identified in FIG. 7A at 702. In some implementations, the signal processing and/or control circuit 702 and/or other circuits (not shown) in the HDD 700 may process data, perform coding and/or encryption, perform calculations, and/or format data that is output to and/or received from a magnetic storage medium 706.

The HDD 700 may communicate with a host device (not shown) such as a computer, mobile computing devices such as personal digital assistants, cellular phones, media or MP3 players and the like, and/or other devices via one or more wired or wireless communication links 708. The HDD 700 may be connected to memory 709 such as random access memory (RAM), low latency nonvolatile memory such as flash memory, read only memory (ROM) and/or other suitable electronic data storage.

Figure 7B:
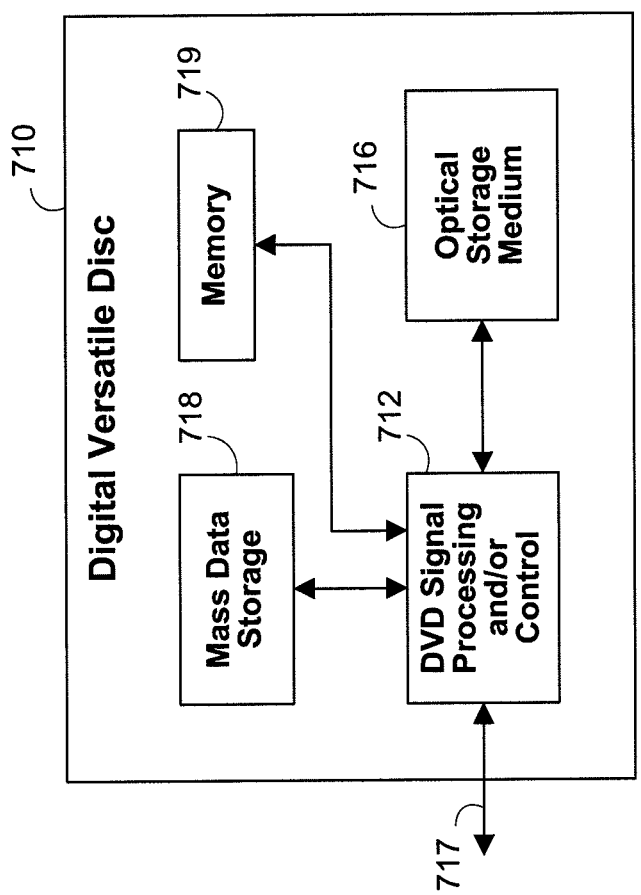
FIG. 7B shows a block diagram of an exemplary digital versatile disc that can employ the disclosed technology.

Referring now to FIG. 7B, the present invention can be implemented in a digital versatile disc (DVD) drive 710. The present invention may implement either or both signal processing and/or control circuits, which are generally identified in FIG. 7B at 712, and/or mass data storage of the DVD drive 710. The signal processing and/or control circuit 712 and/or other circuits (not shown) in the DVD 710 may process data, perform coding and/or encryption, perform calculations, and/or format data that is read from and/or data written to an optical storage medium 716. In some implementations, the signal processing and/or control circuit 712 and/or other circuits (not shown) in the DVD 710 can also perform other functions such as encoding and/or decoding and/or any other signal processing functions associated with a DVD drive.

The DVD drive 710 may communicate with an output device (not shown) such as a computer, television or other device via one or more wired or wireless communication links 717. The DVD 710 may communicate with mass data storage 718 that stores data in a nonvolatile manner. The mass data storage 718 may include a hard disk drive (HDD). The HDD may have the configuration shown in FIG. 7A. The HDD may be a mini HDD that includes one or more platters having a diameter that is smaller than approximately 1.8". The DVD 710 may be connected to memory 719 such as RAM, ROM, low latency nonvolatile memory such as flash memory and/or other suitable electronic data storage.

Figure 7C:
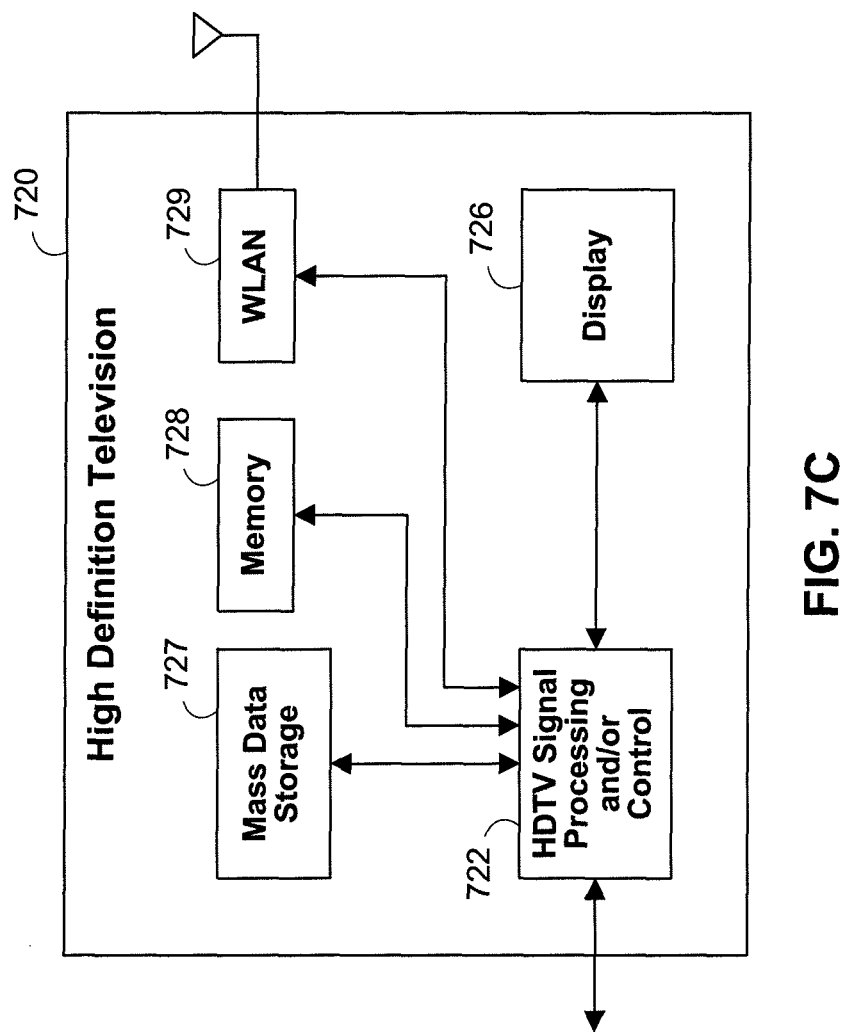
FIG. 7C shows a block diagram of an exemplary high definition television that can employ the disclosed technology.

Referring now to FIG. 7C, the present invention can be implemented in a high definition television (HDTV) 720. The present invention may implement either or both signal processing and/or control circuits, which are generally identified in FIG. 7C at 722, a WLAN interface and/or mass data storage of the HDTV 720. The HDTV 720 receives HDTV input signals in either a wired or wireless format and generates HDTV output signals for a display 726. In some implementations, signal processing circuit and/or control circuit 722 and/or other circuits (not shown) of the HDTV 720 may process data, perform coding and/or encryption, perform calculations, format data and/or perform any other type of HDTV processing that may be required.

The HDTV 720 may communicate with mass data storage 727 that stores data in a nonvolatile manner such as optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The HDTV 720 may be connected to memory 728 such as RAM, ROM, low latency nonvolatile memory such as flash memory and/or other suitable electronic data storage.

The HDTV 720 also may support connections with a WLAN via a WLAN network interface 729.

Figure 7D:
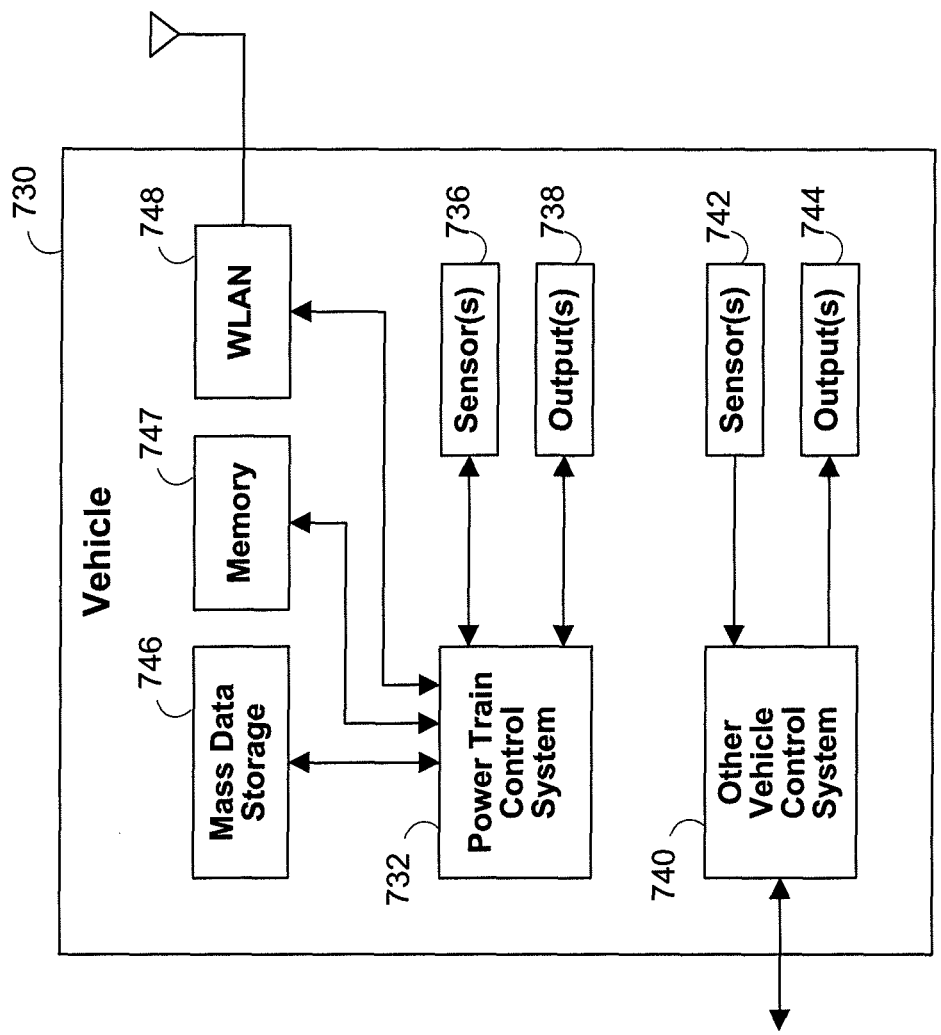
FIG. 7D shows a block diagram of an exemplary vehicle that can employ the disclosed technology.

Referring now to FIG. 7D, the present invention implements a control system of a vehicle 730, a WLAN interface and/or mass data storage of the vehicle control system. In some implementations, the present invention may implement a powertrain control system 732 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 740 of the vehicle 730. The control system 740 may likewise receive signals from input sensors 742 and/or output control signals to one or more output devices 744. In some implementations, the control system 740 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 732 may communicate with mass data storage 746 that stores data in a nonvolatile manner. The mass data storage 746 may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The powertrain control system 732 may be connected to memory 747 such as RAM, ROM, low latency nonvolatile memory such as flash memory and/or other suitable electronic data storage. The powertrain control system 732 also may support connections with a WLAN via a WLAN network interface 748. The control system 740 may also include mass data storage, memory and/or a WLAN interface (all not shown).

Figure 7E:
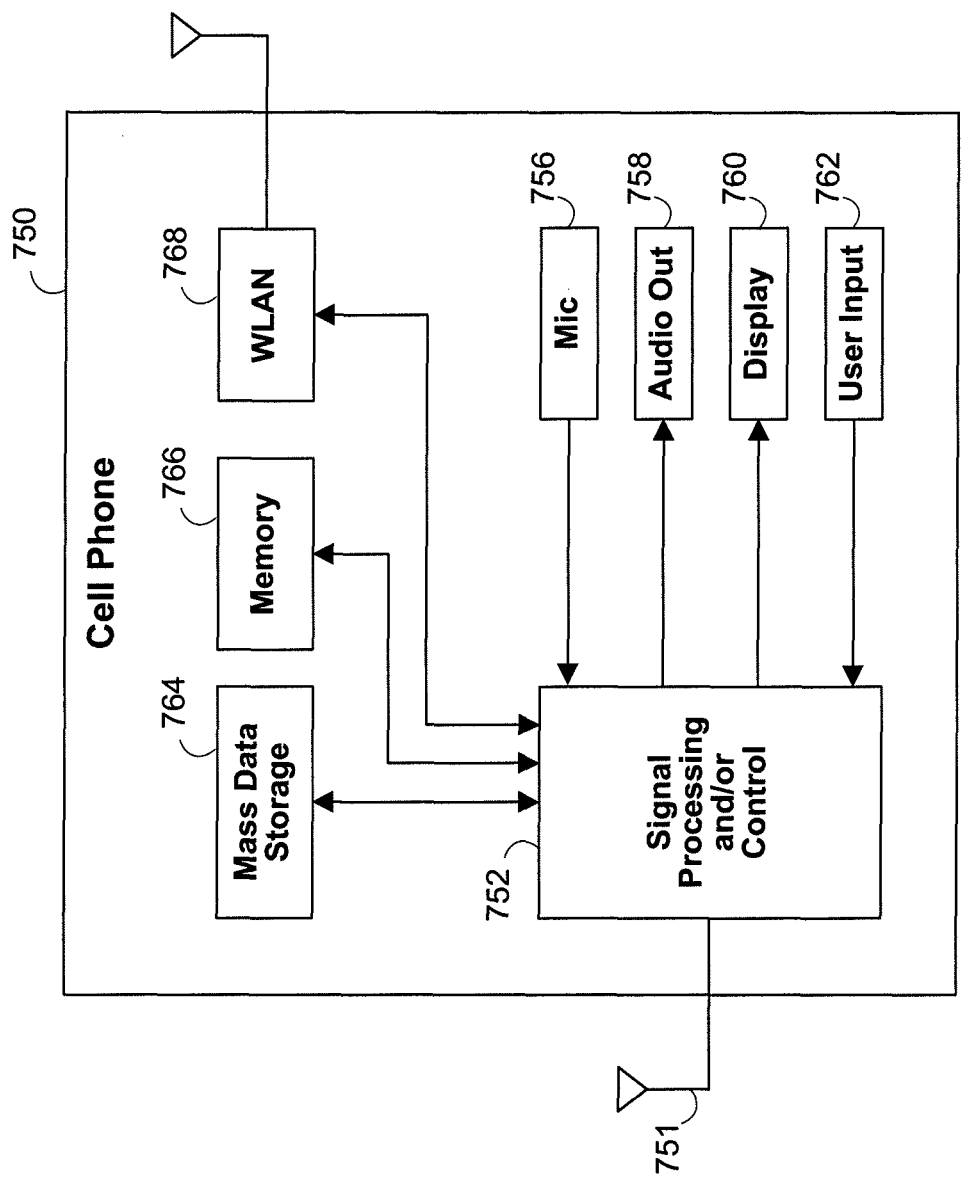
FIG. 7E shows a block diagram of an exemplary cell phone that can employ the disclosed technology.

Referring now to FIG. 7E, the present invention can be implemented in a cellular phone 750 that may include a cellular antenna 751. The present invention may implement either or both signal processing and/or control circuits, which are generally identified in FIG. 7E at 752, a WLAN interface and/or mass data storage of the cellular phone 750. In some implementations, the cellular phone 750 includes a microphone 756, an audio output 758 such as a speaker and/or audio output jack, a display 760 and/or an input device 762 such as a keypad, pointing device, voice actuation and/or other input device. The signal processing and/or control circuits 752 and/or other circuits (not shown) in the cellular phone 750 may process data, perform coding and/or encryption, perform calculations, format data and/or perform other cellular phone functions.

The cellular phone 750 may communicate with mass data storage 764 that stores data in a nonvolatile manner such as optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The cellular phone 750 may be connected to memory 766 such as RAM, ROM, low latency nonvolatile memory such as flash memory and/or other suitable electronic data storage. The cellular phone 750 also may support connections with a WLAN via a WLAN network interface 768.

Figure 7F:
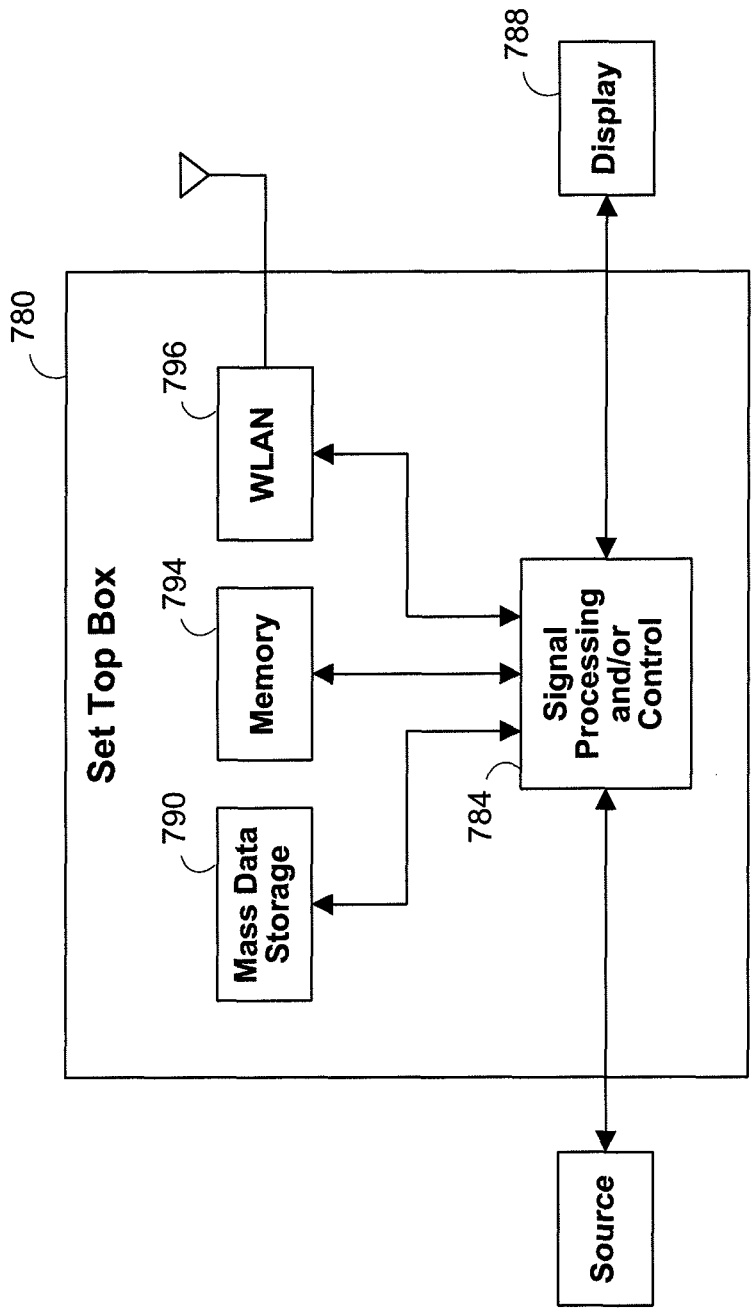
FIG. 7F shows a block diagram of an exemplary set top box that can employ the disclosed technology.

Referring now to FIG. 7F, the present invention can be implemented in a set top box 780. The present invention may implement either or both signal processing and/or control circuits, which are generally identified in FIG. 7F at 784, a WLAN interface and/or mass data storage of the set top box 780. The set top box 780 receives signals from a source such as a broadband source and outputs standard and/or high definition audio/video signals suitable for a display 788 such as a television and/or monitor and/or other video and/or audio output devices. The signal processing and/or control circuits 784 and/or other circuits (not shown) of the set top box 780 may process data, perform coding and/or encryption, perform calculations, format data and/or perform any other set top box function.

The set top box 780 may communicate with mass data storage 790 that stores data in a nonvolatile manner. The mass data storage 790 may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The set top box 780 may be connected to memory 794 such as RAM, ROM, low latency nonvolatile memory such as flash memory and/or other suitable electronic data storage. The set top box 780 also may support connections with a WLAN via a WLAN network interface 796.

Figure 7G:
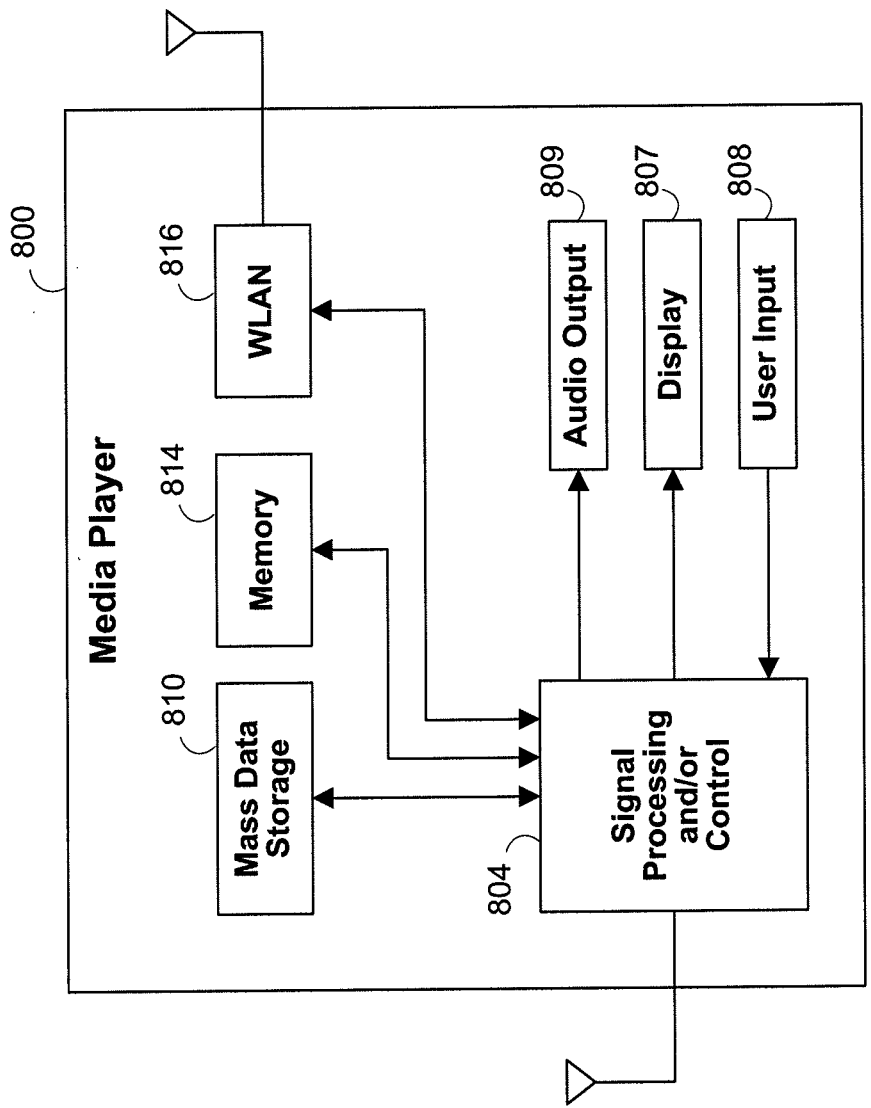
FIG. 7G shows a block diagram of an exemplary media player that can employ the disclosed technology.

Referring now to FIG. 7G, the present invention can be implemented in a media player 800. The present invention may implement either or both signal processing and/or control circuits, which are generally identified in FIG. 7G at 804, a WLAN interface and/or mass data storage of the media player 800. In some implementations, the media player 800 includes a display 807 and/or a user input 808 such as a keypad, touchpad and the like. In some implementations, the media player 800 may employ a graphical user interface (GUI) that typically employs menus, drop down menus, icons and/or a point-and-click interface via the display 807 and/or user input 808. The media player 800 further includes an audio output 809 such as a speaker and/or audio output jack. The signal processing and/or control circuits 804 and/or other circuits (not shown) of the media player 800 may process data, perform coding and/or encryption, perform calculations, format data and/or perform any other media player function.

The media player 800 may communicate with mass data storage 810 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 7A and/or at least one DVD may have the configuration shown in FIG. 7B. The HDD may be a mini HDD that includes one or more platters having a diameter that is smaller than approximately 1.8". The media player 800 may be connected to memory 814 such as RAM, ROM, low latency nonvolatile memory such as flash memory and/or other suitable electronic data storage. The media player 800 also may support connections with a WLAN via a WLAN network interface 816. Still other implementations in addition to those described above are contemplated.

The foregoing describes systems and methods for providing concatenated codes for holographic storage.

One skilled in the art will appreciate that the invention can be practiced by other than the described embodiments, which are presented for purposes of illustration and not of limitation, and the present invention is limited only by the claims that follow.

What is claimed is:

1. A method for implementing a concatenated code on a data storage channel, the method comprising:
   selecting a correction power for an outer BCH code;
   selecting an inner code rate for an inner iteratively decodable code based, at least in part, on an overall system code rate;
   designing the inner iteratively decodable code for the inner code rate, wherein the inner iteratively decodable code has an associated matrix representation;
   designing the outer BCH code for the correction power;
   increasing the correction power for the outer BCH code by allocating one or more bits from the matrix representation to the outer BCH code while maintaining the overall system code rate, wherein the one or more bits are allocated by reducing the number of rows in the matrix representation;
   encoding user information with the outer BCH code and the inner iteratively decodable code; and
   storing the encoded user information on the data storage channel.

2. The method of claim 1 wherein selecting the correction power for the outer BCH code comprises receiving a user-programmable input, and wherein the user-programmable input is indicative of the correction power.

3. The method of claim 2 further comprising dynamically adjusting the correction power based on an expected inner code error rate.

4. The method of claim 1 wherein the inner iteratively decodable code is selected from the group consisting of an LDPC code and a turbo code.

5. The method of claim 1 wherein the data storage channel comprises a holographic data storage channel.

6. The method of claim 5 further comprising:
   interleaving the encoded user information stored on the holographic data storage channel; and
   generating a plurality of codewords from the interleaved, encoded user information.

7. The method of claim 6 wherein interleaving the encoded user information comprises interleaving encoded user information stored across more than one page of the holographic data storage channel.

8. The method of claim 1 wherein the inner iteratively decodable code comprises an LDPC code, the method further comprising:
constructing a mother matrix representation of a quasi-cyclic parity check matrix for the LDPC code;
reducing the number of rows in the mother matrix representation; and
increasing the correction power for the outer BCH code while maintaining a constant overall system code rate.

9. The method of claim 1 wherein the inner iteratively decodable code comprises at least two different LDPC codes.

10. The method of claim 9 further comprising:
constructing at least two mother matrix representations of at least two quasi-cyclic parity check matrices for the at least two different LDPC codes, wherein the at least two different LDPC codes are associated with the same circulant size $S_c$, and wherein the at least two mother matrix representations have a different number of rows; and
receiving a user-programmable input that selects one of the at least two different LDPC codes.

11. The method of claim 10 further comprising dynamically selecting one of the at least two different LDPC codes based, at least in part, on error statistics associated with the data storage channel.

12. A system for implementing a concatenated code, comprising:
an outer BCH code associated with a correction power;
an inner iteratively decodable code associated with a matrix representation and an inner code rate, wherein the inner code rate is based, at least in part, on an overall system code rate;
an encoder to encode user information using the outer BCH code and the inner iteratively decodable code, wherein the encoder is configured to increase the correction power for the outer BCH code by allocating one or more bits from the matrix representation to the outer BCH code while maintaining the overall system code rate, and wherein the one or more bits are allocated by reducing the number of rows in the matrix representation; and
a data storage channel to store the encoded user information.

13. The system of claim 12 wherein the correction power for the outer BCH code is selected based on at least one user-programmable input that is indicative of the correction power.

14. The system of claim 13 wherein the encoder is configured to dynamically adjust the correction power based on an expected inner code error rate.

15. The system of claim 12 wherein the inner iteratively decodable code is selected from the group consisting of an LDPC code and a turbo code.

16. The system of claim 12 wherein the data storage channel comprises a holographic data storage channel.

17. The system of claim 16 further comprising:
an interleaver configured to interleave the encoded user information stored on the holographic data storage channel, wherein the encoder generates a plurality of codewords from the interleaved, encoded user information.

18. The system of claim 17 wherein the interleaver is configured to interleave encoded user information stored across more than one page of the holographic data storage channel.

19. The system of claim 12 wherein the inner iteratively decodable code comprises an LDPC code and wherein the encoder is configured to:
construct a mother matrix representation of a quasi-cyclic parity check matrix for the LDPC code;
reduce the number of rows in the mother matrix representation; and
increase the correction power for the outer BCH code while maintaining a constant overall system code rate.

20. The system of claim 12 wherein the inner iteratively decodable code comprises at least two different LDPC codes.

21. The system of claim 20 wherein the encoder is configured to:
construct at least two mother matrix representations of at least two quasi-cyclic parity check matrices for the at least two different LDPC codes, wherein the at least two different LDPC codes are associated with the same circulant size $S_c$, and wherein the at least two mother matrix representations have a different number of rows; and
receive a user-programmable input that selects one of the at least two different LDPC codes.

22. The system of claim 21 wherein the encoder is configured to dynamically select one of the at least two different LDPC codes based, at least in part, on error statistics associated with the data storage channel.

* * * * *